United States Patent
Motamed et al.

(10) Patent No.: US 9,338,668 B2
(45) Date of Patent: May 10, 2016

(54) GAIN CONTROL FOR INTRA-BAND CARRIER AGGREGATION

(71) Applicant: QUALCOMM Incorporated, San Diego, CA (US)

(72) Inventors: Mariam Motamed, Redwood City, CA (US); Wesley A. Sampson, La Jolla, CA (US); Alexei Yurievitch Gorokhov, San Diego, CA (US); Pengkai Zhao, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 274 days.

(21) Appl. No.: 14/062,674

(22) Filed: Oct. 24, 2013

(65) Prior Publication Data

US 2014/0126401 A1     May 8, 2014

Related U.S. Application Data

(60) Provisional application No. 61/723,730, filed on Nov. 7, 2012.

(51) Int. Cl.
*H04B 1/06*        (2006.01)
*H04W 24/02*     (2009.01)
(Continued)

(52) U.S. Cl.
CPC ............ *H04W 24/02* (2013.01); *H03G 3/3052* (2013.01); *H03G 3/32* (2013.01); *H04L 5/001* (2013.01); *H04L 5/006* (2013.01); *H04L 27/2646* (2013.01); *H04L 27/2647* (2013.01);
(Continued)

(58) Field of Classification Search
CPC . H04L 27/2601; H04L 27/2647; H04L 5/001; H03G 3/3036; H03G 3/3068; H03G 3/3078; H04B 1/0067
USPC ..................... 455/132, 553.1, 245.1; 375/345
See application file for complete search history.

(56) References Cited

U.S. PATENT DOCUMENTS 7,539,469 B2 *   5/2009   Zahm ................... H04N 5/4401
                                                   455/130
7,809,343 B2 * 10/2010   Lai ....................... H04L 27/2647
                                                   455/132

(Continued)

FOREIGN PATENT DOCUMENTS

EP          1249955 B1     1/2011

OTHER PUBLICATIONS

International Search Report and Written Opinion—PCT/US2013/066975—ISA/EPO—Dec. 18, 2013.
(Continued)

*Primary Examiner* — Duc M Nguyen
(74) *Attorney, Agent, or Firm* — Harrity & Harrity, LLP

(57) ABSTRACT

In a wireless communication system, carrier aggregation may be used to provide desired amounts of bandwidth, where a primary carrier and one or more secondary carriers are aggregated. At the receive side of a system in which the aggregated carriers are in a single frequency band, an amplifier may be used to apply a common gain to the aggregated carriers in the single frequency band, and the common gain may be determined as a function of indications of received signal quality associated with groups of aggregated carriers containing one or more of the aggregated carriers, where one group contains the primary carrier and possible one or more secondary carriers and another group contains only secondary carriers.

21 Claims, 7 Drawing Sheets

(51) Int. Cl.
  *H04L 5/00* (2006.01)
  *H04L 27/26* (2006.01)
  *H03G 3/30* (2006.01)
  *H03G 3/32* (2006.01)
  *H04L 27/38* (2006.01)
  *H04B 1/00* (2006.01)

(52) U.S. Cl.
  CPC .......... *H04L 27/3809* (2013.01); *H04B 1/0067* (2013.01); *H04L 5/0023* (2013.01)

(56) References Cited

U.S. PATENT DOCUMENTS

| | | | | |
|---|---|---|---|---|
| 8,160,527 B2* | 4/2012 | Jonsson | ............... | H03G 3/3078 375/345 |
| 8,213,891 B2* | 7/2012 | Kim | ................... | H03G 3/3068 375/345 |
| 8,483,647 B2* | 7/2013 | Kaukovuori | ............ | H04B 1/16 375/324 |
| 8,548,410 B2* | 10/2013 | Jussila | ................. | H04B 1/0075 455/189.1 |
| 8,831,690 B2* | 9/2014 | Perets | .................... | H04W 4/00 455/522 |
| 8,903,343 B2* | 12/2014 | Holenstein | ............... | H04B 1/16 455/132 |
| 2001/0006359 A1 | 7/2001 | Suzuki et al. | | |
| 2003/0112880 A1 | 6/2003 | Walton et al. | | |
| 2007/0041481 A1* | 2/2007 | Malkemes | ........... | H03G 1/0088 375/345 |
| 2008/0013654 A1* | 1/2008 | Rick | .................... | H03G 3/3068 375/345 |
| 2010/0248665 A1* | 9/2010 | Jonsson | ............... | H03G 3/3078 455/140 |
| 2011/0268232 A1 | 11/2011 | Park et al. | | |
| 2012/0213096 A1 | 8/2012 | Krishnamurthy et al. | | |
| 2013/0136211 A1 | 5/2013 | Jussila et al. | | |
| 2014/0192663 A1* | 7/2014 | Rosa | ................... | H04W 52/244 370/252 |

OTHER PUBLICATIONS

Motorola Mobility: "Discussion on UE RF impairments of intraband carrier aggregation", 3GPP Draft; R4-113466, 3rd Generationpartnership Project (3GPP), Mobile Competence Centre; 650, Route Des Lucioles; F-06921 Sophia-Antipolis Cedex, France, vol. RAN WG4, no. Roma; 20110627, Jun. 26, 2011, XP050542928, [retrieved on Jun. 26, 2011] p. 2.

Nokia et al., "Image Rejection in intraband carrier aggregation", 3GPP Draft; R4-103677, 3rd Generation Partnership Project (3GPP), Mobile Competence Centre., 650, Route Des L. Ucioles., F-06921 Sophia-Antipolis Cedex, France, vol. RAN WG4, no. Xian; 20101011, Oct. 7, 2010, XP050455346, [retrieved on Oct. 7, 2010], p. 1, p. 5.

* cited by examiner

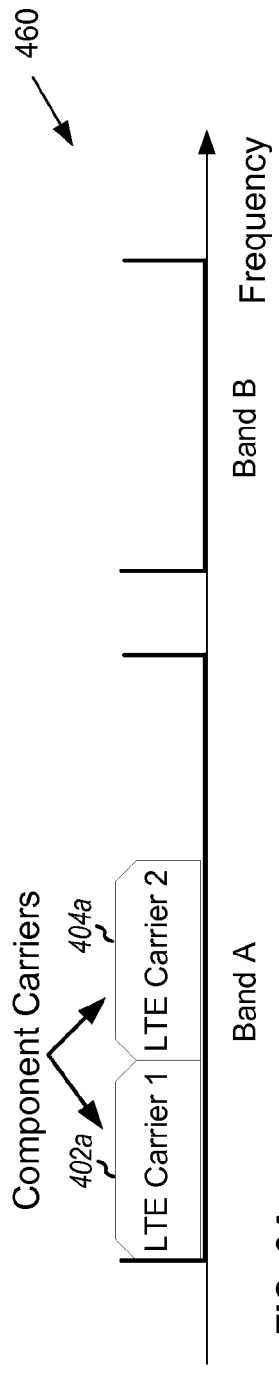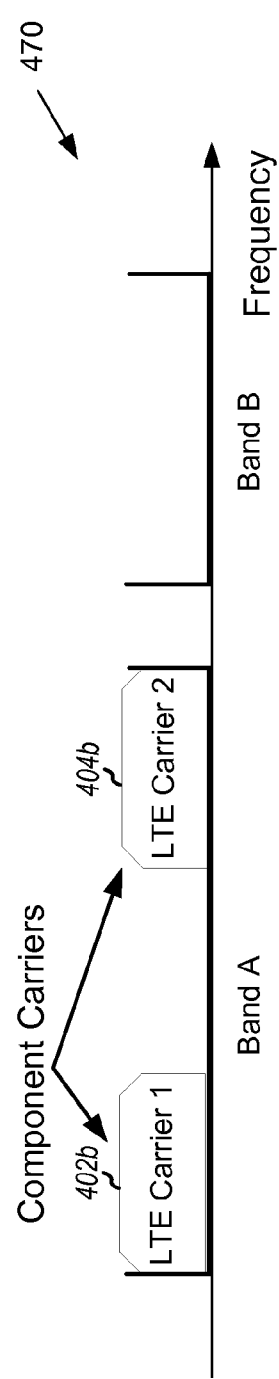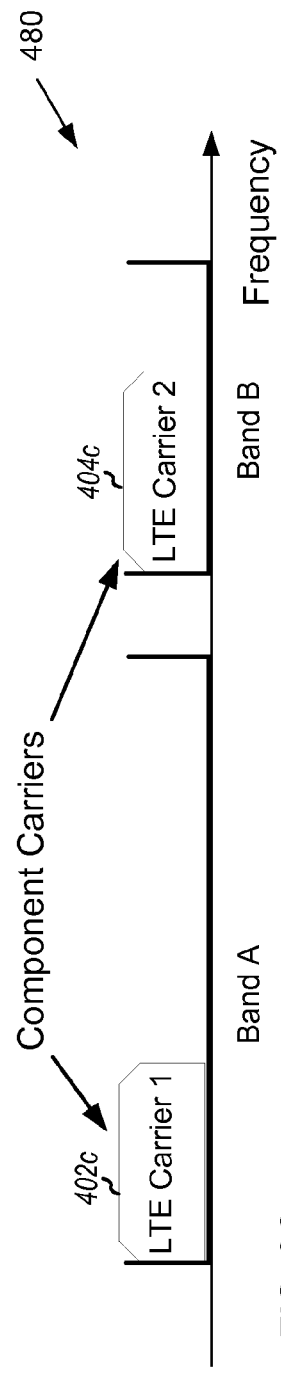

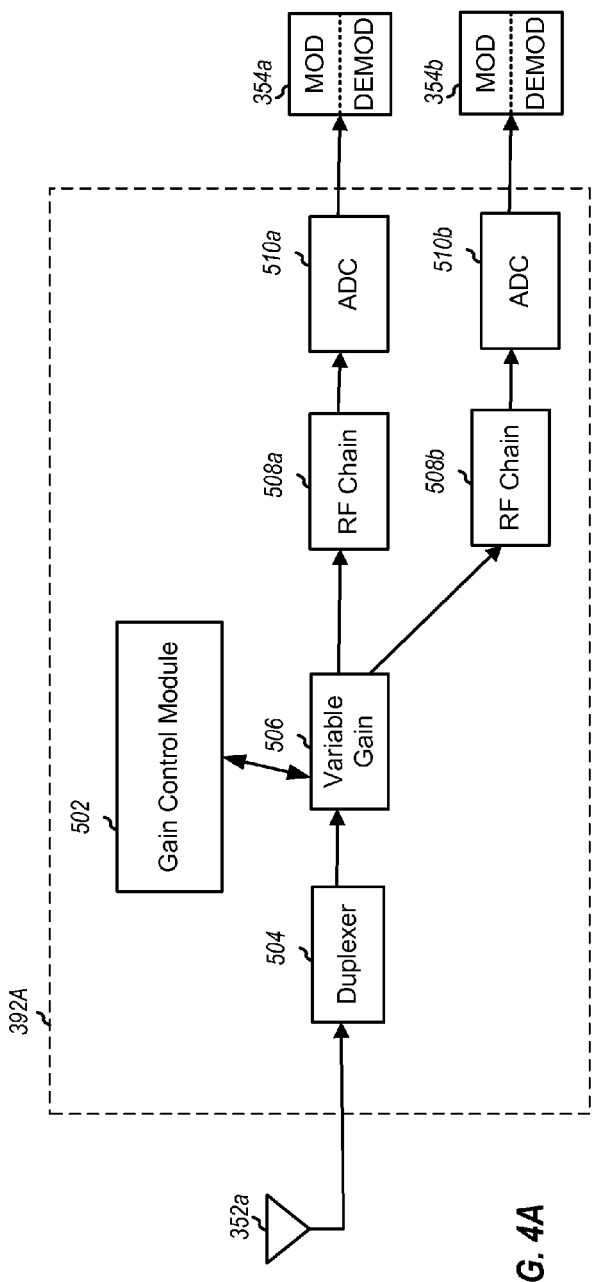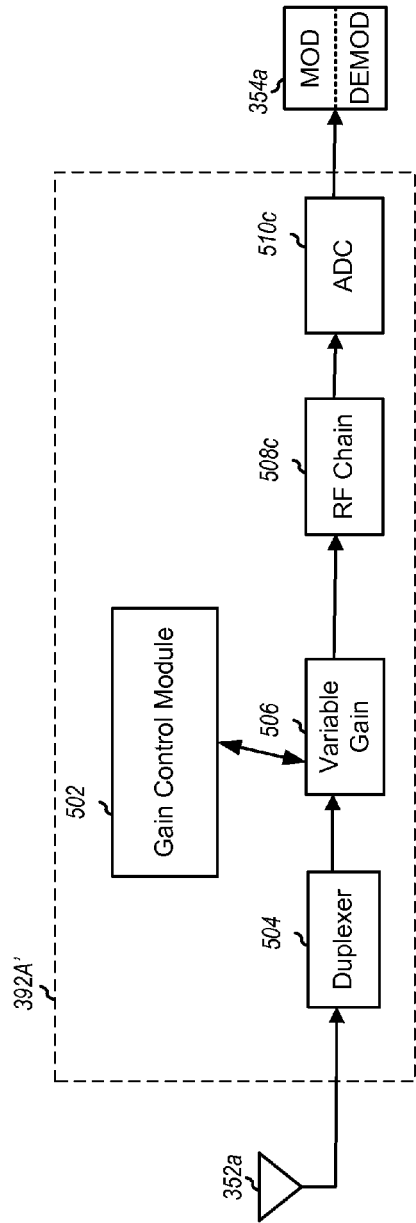

GAIN CONTROL FOR INTRA-BAND CARRIER AGGREGATION

CROSS-REFERENCE TO RELATED APPLICATION

This application claims priority to U.S. Provisional Patent Application No. 61/723,730, filed on Nov. 7, 2012, the entirety of which is incorporated by reference herein.

BACKGROUND

I. Field

Various aspects of the present disclosure may relate to communication systems and/or to techniques for gain control in intra-band carrier aggregation.

II. Background

Wireless communication networks are widely deployed to provide various communication content such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of communication terminals, such as, for example, user equipments (UEs). A UE may communicate with a base station via the downlink (DL) and uplink (UL). The DL (or forward link) refers to the communication link from the base station to the UE, and the UL (or reverse link) refers to the communication link from the UE to the base station.

The 3rd Generation Partnership Project (3GPP) Long Term Evolution (LTE) represents a major advance in cellular technology as an evolution of Global System for Mobile communications (GSM) and Universal Mobile Telecommunications System (UMTS). The LTE physical layer (PHY) provides a highly efficient way to convey both data and control information between base stations, such as an evolved Node Bs (eNBs), and communication terminals.

BRIEF DESCRIPTION OF THE DRAWINGS

FIG. 3A illustrates an intra-band contiguous carrier aggregation type.

FIG. 3B illustrates an intra-band non-contiguous carrier aggregation type.

FIG. 3C illustrates an inter-band carrier aggregation type.

FIGS. 4A-B illustrate aspects of common gain control for intra-band carrier aggregation.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies. For clarity, certain aspects of the techniques are described below for LTE, and LTE terminology is used in much of the description below.

Figure 1:
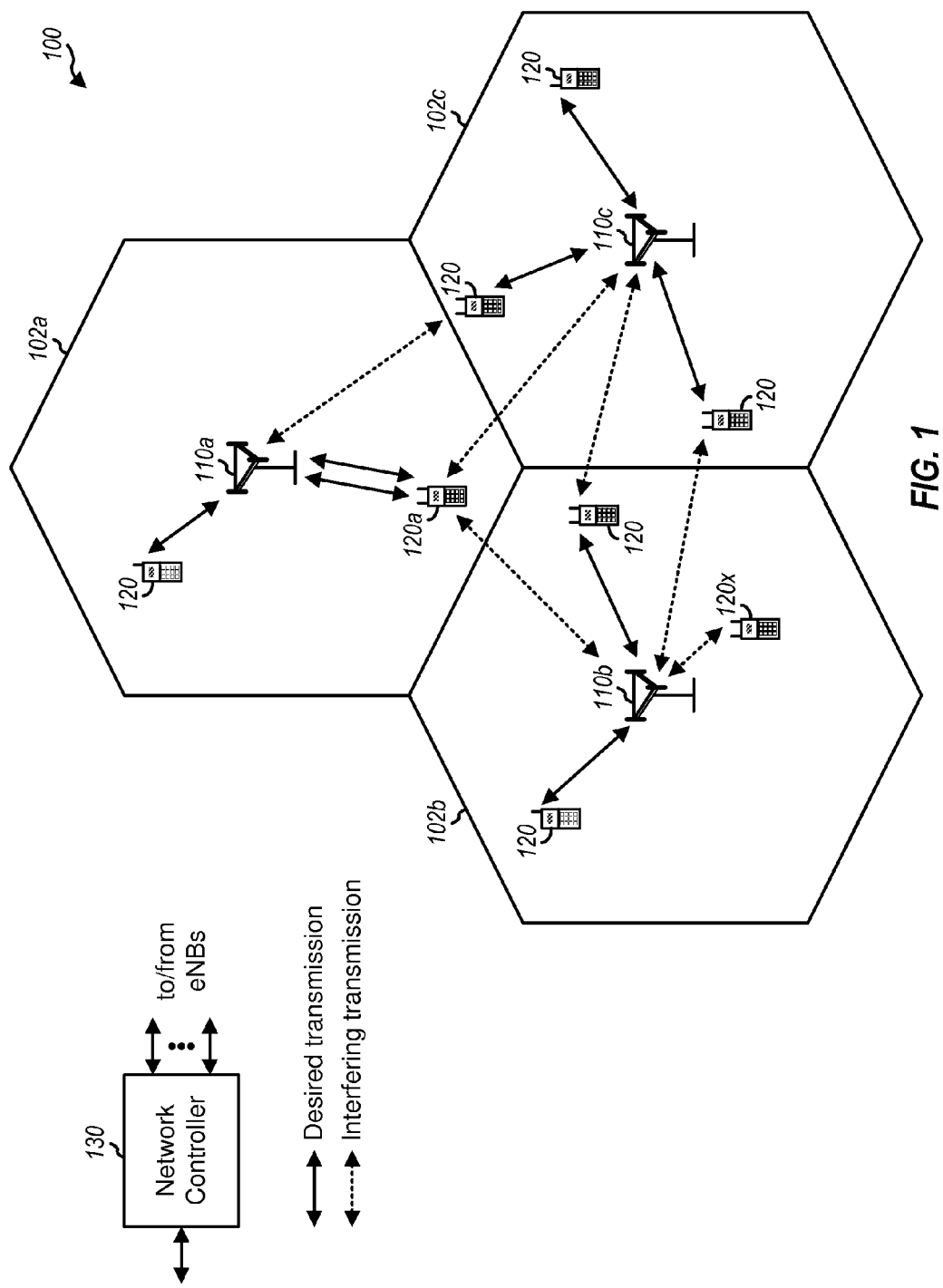
FIG. 1 is a block diagram of an example of a telecommunications system.

FIG. 1 shows a wireless communication network 100, which may be, but is not limited to, an LTE network. The wireless network 100 may include a number of eNBs 110 and other network entities. An eNB may be a station that communicates with UEs and may also be referred to as a base station, a Node B, an access point, or other term. Each eNB 110a, 110b, 110c may provide communication coverage for a particular geographic area. In 3GPP, the term "cell" can refer to a coverage area of an eNB and/or an eNB subsystem serving this coverage area, depending on the context in which the term is used.

An eNB may provide communication coverage for a macro cell, a pico cell, a femto cell, and/or other types of cell. A macro cell may cover a relatively large geographic area (e.g., several kilometers in radius) and may allow unrestricted access by UEs with service subscription. An eNB for a macro cell may be referred to as a macro eNB. In the example shown in FIG. 1, the eNBs 110a, 110b and 110c may be macro eNBs for the macro cells 102a, 102b and 102c, respectively. An eNB may support one or multiple (e.g., three) cells.

The wireless network 100 may be a heterogeneous network that includes eNBs of different types, e.g., macro eNBs, pico eNBs, femto eNBs, relays, etc. These different types of eNBs may have different transmit power levels, different coverage areas, and different impact on interference in the wireless network 100. For example, macro eNBs may have a high transmit power level (e.g., 20 Watts).

The wireless network 100 may support synchronous or asynchronous operation. For synchronous operation, the eNBs may have similar frame timing, and transmissions from different eNBs may be approximately aligned in time. For asynchronous operation, the eNBs may have different frame timing, and transmissions from different eNBs may not be aligned in time. The techniques described herein may be used for both synchronous and asynchronous operation.

A network controller 130 may couple to a set of eNBs and provide coordination and control for these eNBs. The network controller 130 may communicate with the eNBs 110 via a backhaul. The eNBs 110 may also communicate with one another, e.g., directly or indirectly via wireless or wireline backhaul.

The UEs 120 may be dispersed throughout the wireless network 100, and each UE may be stationary or mobile. A UE may also be referred to as a terminal, a mobile station, a subscriber unit, a station, etc. and generally refers to a communication device that may be used by a user, as opposed to a network component (such as an eNB, network controller, or other network entities). A UE may be a cellular phone, a personal digital assistant (PDA), a wireless modem, a wireless communication device, a handheld device, a laptop computer, a cordless phone, a wireless local loop (WLL) station, or other mobile entities.

A UE may be able to communicate with macro eNBs, pico eNBs, femto eNBs, relays, or other network entities. In FIG. 1, a solid line with double arrows indicates desired transmissions between a UE and a serving eNB, which is an eNB designated to serve the UE on the downlink and/or uplink. A dashed line with double arrows indicates interfering transmissions between a UE and an eNB. The single solid line between the UE and serving eNB may indicate a communication link between the UE and serving eNB. Multiple solid lines may indicate the UE configured for carrier aggregation (CA).

LTE-Advanced UEs may use spectrum, in up to 20 MHz bandwidths, allocated in a carrier aggregation of up to a total of 100 MHz (5 component carriers) used for transmission in each direction. The two solid lines between UE 120a and base station 110a illustrate support for two component carriers, which may include a primary component carrier (PCC) and a secondary component carrier (SCC). Up to 5 component carriers, including the PCC and one or more secondary component carriers, may be supported between UE 120a and base station 110a. The PCC may carry control signaling. All component carriers, including the PCC may carry traffic data. Carrier aggregation may be configured for contiguous and/or non-contiguous CA. Carrier aggregation may be configured for intra-band and inter-band type CA. For example, the component carriers for UE 120a may be configured for contiguous intra-band carrier aggregation.

Intra-band carrier aggregation presents both challenges and opportunities in the design of LTE systems. Because two or more component carriers are supported on a same operating band, a more efficient receiver implementation may be possible at the eNB and/or at the user equipment. For example, with intra-band carrier aggregation, a user equipment may share all or part of a receive chain between component carriers, which may serve to reduce hardware complexity. However, due to multi-path effects and other phenomena in the RF environment, the received signal strength of the intra-band component carriers may vary significantly. This can potentially lead to suboptimal receive processing and, in a worst case scenario, radio link failure. Accordingly, the present disclosure provides techniques that may be used to provide for efficient and reliable communications with intra-band band carrier aggregation.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers may be dependent on the system bandwidth.

A UE may be within the coverage of multiple eNBs. One of these eNBs may be selected to serve the UE. The serving eNB may be selected based on various criteria such as received power, path loss, signal-to-noise ratio (SNR), etc. The UE may monitor the received signal quality on the PCC during radio link monitoring (RLM). The UE, at the physical layer, may estimate a signal quality metric, such as a signal to interference plus noise ratio (SINR) for the PCC and/or a block error rate (BLER) associated with, e.g., Physical Downlink Control Channel (PDCCH) transmissions on the PCC. Based on predetermined SINR and/or BLER thresholds, the UE may declare an out-of-sync (OOS) or an in-sync (IS) condition with respect to the serving cell. If an OOS condition persists, radio link failure may be declared by higher layers. Thus, for intra-band carrier aggregation, it may be important to ensure that a proper gain is applied to the PCC in the intra-band carrier aggregation scenario, even if it is at the expense of SCC signal quality.

Figure 2:
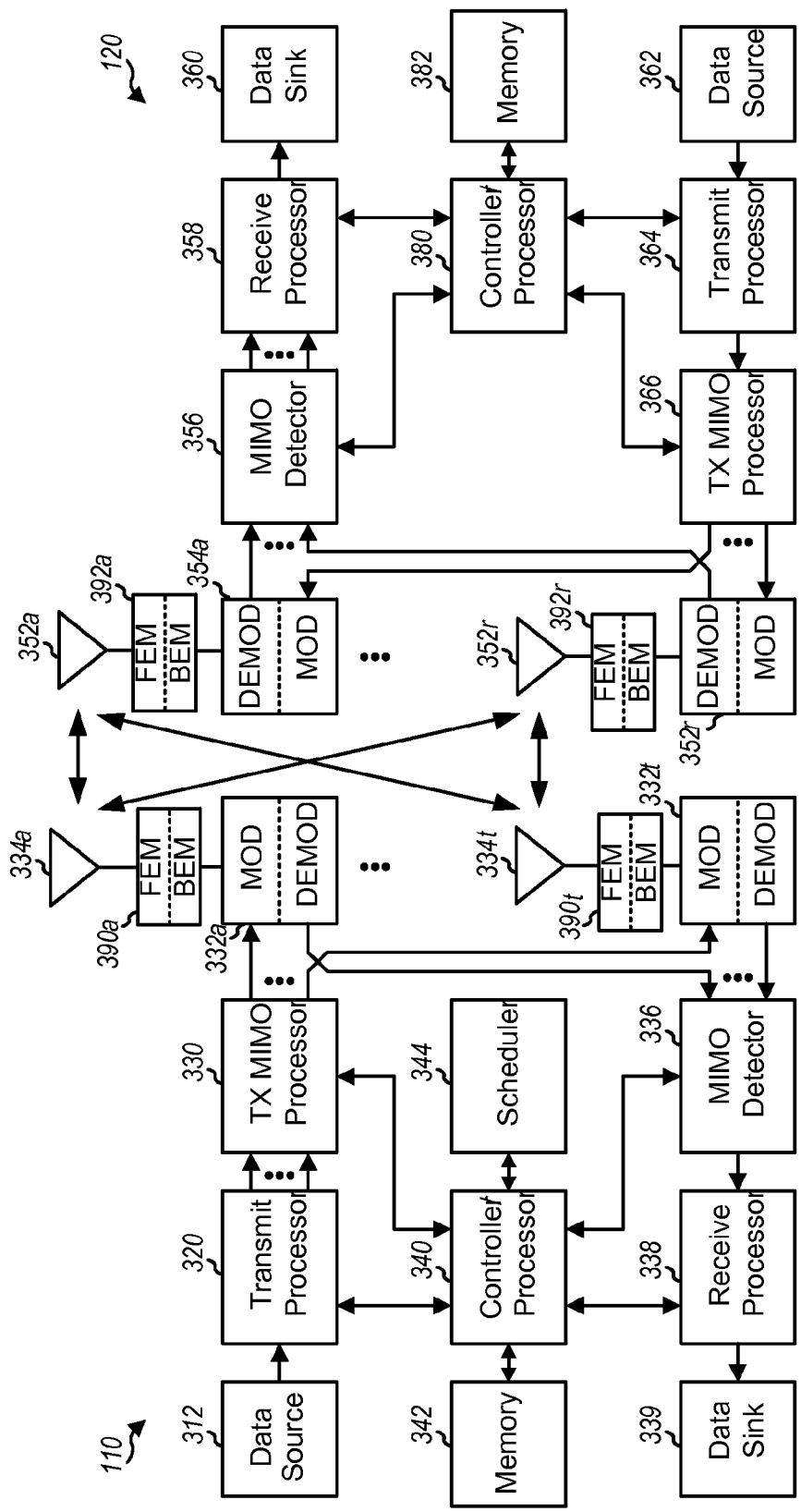
FIG. 2 shows a block diagram illustrating a design of a base station/eNB and a UE.

FIG. 2 shows a block diagram of a design of a base station/ eNB 110 and a UE 120, which may be one of the base stations/eNBs and one of the UEs in FIG. 1. The base station 110 may be the macro eNB 110c in FIG. 1, and the UE 120 may be the UE 120a. The base station 110 may be equipped with antennas 334a through 334t, and the UE 120 may be equipped with antennas 352a through 352r.

At the base station 110, a transmit processor 320 may receive data from a data source 312 and control information from a controller/processor 340. The control information may be for various control channels. The data may be for the various data channels. The TX processor 320 may process data for multiple component carriers for carrier aggregation. The TX processor 320 may process (e.g., encode and symbol map) the data and control information to obtain data symbols and control symbols, respectively. The TX processor 320 may also generate reference symbols, e.g., for the PSS, SSS, and cell-specific reference signal.

A transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) 332a through 332t. Each modulator 332 may process a respective output symbol stream (e.g., for OFDM, etc.) to obtain an output sample stream. Each back end module (BEM) 390a through 390t may further process (e.g., convert to analog, amplify, filter, and upconvert) the output sample stream to obtain a downlink signal. Downlink signals from modulators 332a through 332t may be transmitted via the antennas 334a through 334t, respectively.

At the UE 120, the antennas 352a through 352r may receive the downlink signals from the base station 110 and may provide received signals to the front end modules (FEM) 392a through 392r. The received signals may be signals from multiple aggregated carriers. Each front end module 392 may condition (e.g., filter, amplify, downconvert, and digitize) a respective received signal to obtain input samples. Each demodulator (DEMODs) 354a through 354r, respectively, may further process the input samples (e.g., for OFDM, etc.)

to obtain received symbols. A MIMO detector 356 may obtain received symbols from all the demodulators 354a through 354r, perform MIMO detection on the received symbols if applicable, and provide detected symbols. A receive processor 358 may process (e.g., demodulate, deinterleave, and decode) the detected symbols, provide decoded data for the UE 120 to a data sink 360, and provide decoded control information to a controller/processor 380.

On the uplink, at the UE 120, a transmit processor 364 may receive and process data (e.g., for the PUSCH) from a data source 362 and control information (e.g., for the PUCCH) from the controller/processor 380. The processor 320 may process data for multiple aggregated carriers. The processor 364 may also generate reference symbols for a reference signal. The symbols from the transmit processor 364 may be precoded by a TX MIMO processor 366 if applicable, further processed by the modulators 354a through 354r (e.g., for SC-FDM, etc.), and transmitted to the base station 110. At the base station 110, the uplink signals from the UE 120 may be received by the antennas 334, processed by the back end modules 390 and demodulators 332, detected by a MIMO detector 336 if applicable, and further processed by a receive processor 338 to obtain decoded data and control information sent by the UE 120. A single antenna may be shared between the uplink and downlink signals via a duplexer as shown in FIGS. 4 A-B. The processor 338 may provide the decoded data to a data sink 339 and the decoded control information to the controller/processor 340.

The controllers/processors 340 and 380 may direct the operation at the base station 110 and the UE 120, respectively. The processor 340 and/or other processors and modules at the base station 110 may perform or direct the execution of various processes for the techniques described herein. The processor 380 and/or other processors and modules at the UE 120 may also perform or direct the execution of functional blocks, and/or other processes for the techniques described herein. The memories 342 and 382 may store data and program codes for the base station 110 and the UE 120, respectively. A scheduler 344 may schedule UEs for data transmission on the downlink and/or uplink.

In one configuration, the UE 120 or eNB 110 for wireless communication may include means for estimating received signal power for at least two component carriers (CCs) in a same radio frequency band, where the at least two CCs may be configured for carrier aggregation and may include a primary component carrier (PCC) and one or more secondary component carriers (SCCs). For example, demodulator 354, MIMO detector 356, and RX processor 358 may cooperate to determine an RSRP (reference signal received power), RSSI (received signal strength indicator), RSRQ (reference signal receive quality) or other measurement or estimate of received signal power, or alternatively, quality.

In general, means may be provided for estimating and/or measuring an indication of the quality of one or more of the CCs of the received signal. Such means may be implemented using analog and/or digital methods and may involve, for example, one or more filter banks (analog or digital or combinations) configured to separate the CCs and corresponding analog and/or digital means for measuring and or estimating corresponding signal quality. For example, signal levels, signal strengths, signal powers, error rates, etc., may be determined, by measurement or estimation, and may be used as an indication of the quality of a CC. Analog means may include, e.g., multipliers, squarers, integraters, etc., and digital means may include, e.g., digital multipliers, squarers, integraters/ summations, etc. Digital means may, alternatively or additionally, include a processing device programmed (e.g., using software instructions stored in a memory component) to perform all or some of the operations for providing the indication of CC quality. Furthermore, all or portions of the means for estimating and/or measuring may be shared among multiple CCs, e.g., by multiplexing, by using parallel threads in a processor, etc.

Returning to FIG. 2, in order to share all or portions of receive chains, the UE 120 and/or eNB 110 may use a common gain for the at least two CCs. In one example, a controller/processor 380 or common gain element may be coupled to elements of the receive chain. Based on indications of received CC qualities, the controller/processor 380 or gain element may determine a common gain to be applied to the CCs in the received signal.

In another example, the common gain control element may be included as part of front end module 392 with other receive chain elements. Based on the received signal power, the front end module 392 (e.g., via the gain control element within the front end module 392) may determine a common gain for the intra-band CCs, again based on the indications of received CC qualities.

According to various aspects of this disclosure, indications of received CC quality may be determined (i.e., measured and/or estimated) in two ways. According to a first example, an indication of quality of the PCC may be determined alone, as a first quality indication, and a second quality indication may be based on the one or more SCCs. In a second example, the first quality indication may be based on the PCC and one or more of the SCCs, and the second quality indication may be based on one or more SCCs. For purposes of discussion, the first quality indication will be referred to as the "primary estimate," and the second quality indication will be referred to as the "secondary estimate." It is noted, again, that the primary estimate may include the PCC and at least one SCC, in one example, and that either or both of the primary and secondary estimates may be (based on) measurements.

In one aspect of the present disclosure, a common gain may be determined for application to the received signal, including the various CCs, where the common gain may be determined based on the primary and secondary estimates. The UE 120 or eNB 110 may include means for applying the common gain to received signals to obtain adjusted received signals. For example, a variable gain, low-noise amplifier may be coupled to a gain control element and configured to apply the resulting common gain to the CCs.

The UE 120 or eNB 110 may further include means for processing the adjusted received signals as part of a wireless communication. In one aspect, the aforementioned means may be the processor(s), the controller/processor 380, the memory 382, the receive processor 358, the MIMO detector 356, the demodulators 354a, and the antennas 352a configured to perform the functions recited by the aforementioned means. In another aspect, the aforementioned means may be a module or any apparatus configured to perform the functions recited by the aforementioned means. In another aspect, at least portions of the aforementioned means may be in the front end module 392A, 392A' illustrated in FIGS. 5A-B, such as RF chains 508.

FIGS. 3A-C illustrate intra-band and inter-band configurations with contiguous and non-contiguous carriers for carrier aggregation. Intra-band CA occurs when multiple available component carriers are located in the same radio frequency band, as illustrated by the examples of FIGS. 3A and 3B. Inter-band CA, an example of which is shown in FIG. 3C, occurs when multiple available component carriers are located in different radio frequency bands.

FIG. 3A illustrates intra-band contiguous CA 460. Component carriers 402a, 404a are located in the same Band A frequency band (intra-band) and are adjacent to each other (contiguous CA). Component carrier 402a may be the PCC while component carrier 404a may be the SCC.

FIG. 3B illustrates intra-band non-contiguous CA 470. Component carriers 402b, 404b are located in the same Band A frequency band (intra-band) and are not adjacent to each other (non-contiguous CA). Component carrier 402b may be the PCC while component carrier 404b may be the SCC.

Because the intra-band CCs of FIGS. 3A and 3B occupy a same frequency band, parts of the receive chain may be shared between the aggregated CCs in order to reduce hardware complexity. For example, a single wideband-capable front end module may be used to process the CCs. For example, one or more RF receiving units may be utilized or parts of the receiving unit, such as the gain element may be shared. Due to multipath effects, Doppler shift, and other phenomena, received power may vary between aggregated CCs requiring more sophisticated algorithms for determining common gain. For example, the intra-band PCC 402a and SCC 404a signals may be received via a same receive chain with a common gain applied. The PCC 402a may be selected for favorable treatment to avoid RLF, with the algorithms for determining the common gain favoring the signal quality of the PCC 402a.

For the sake of completeness, and in contrast with FIGS. 3A and 3B, FIG. 3C illustrates an example of inter-band non-contiguous CA 480. Component carriers 402c, 404c are located in different bands (inter-band), frequency band B and frequency band A, and are not adjacent to each other (non-contiguous CA). Component carrier 402c may be the PCC while component carrier 404c may be the SCC. In addition, SCCs may be added or removed without affecting the basic operation of the UE, including physical channel establishment and RLF procedures which are layer 2 procedures, such as in the 3GPP Technical Specification 36.331 for the LTE radio resource control (RRC) protocol.

Multiple RF receiving units and multiple Fast Fourier Transform (FFT) units may be deployed with inter-band CA in LTE-Advanced UE since the carriers are typically separated far along the frequency band. Because non-contiguous CA supports data transmissions over multiple separated carriers across a large frequency range, propagation path loss, Doppler shift and other radio channel characteristics may vary significantly at different frequency bands.

Thus, to support broadband data transmission under the non-contiguous CA approach, methods may be used to adaptively adjust coding, modulation and transmission power for different component carriers. For example, in an LTE-Advanced system where the enhanced NodeB (eNB) has fixed transmitting power on each component carrier, the effective coverage or supportable modulation and coding of each component carrier may be different.

According to aspects of the present disclosure, techniques are presented for addressing common gain control that may be used for intra-band CCs. However, these techniques may also be applied in "hybrid" scenarios, in which a group of aggregated CCs are provided in a common band, while one or more other CCs are provided in a different band. In such cases, the intra-band techniques discussed herein may be combined with the use of inter-band techniques, where the intra-band techniques may be used for the aggregated CCs located in the common band. That is, in effect, the intra-band gain control techniques may be used as a subset/sub-case of an inter-band technique.

The aspects of the present disclosure may also be applied to CCs that are in different RF bands if frequency separation between the CCs is similar to frequency separation of intra-band CA such that CCs can be processed with sharing part or all of the receive chain.

Turning now to the intra-band CC aggregation case, techniques for common gain control for gain to be applied to a received signal carrying the intra-band CCs, in a device such as a UE or eNB, may be provided. According to various aspects of this disclosure, sharing all or part of a receive chain in the front end module between aggregated carriers may reduce hardware complexity. For example, processing the CA signals through a common gain element with common gain control may be advantageously implemented for reduced power consumption. A user of the UE may benefit from longer battery life and longer intervals between battery recharge. The common gain element with common gain control may lower the bill of materials because the device (e.g., a UE or eNB) may use a reduced number of logic devices to achieve a smaller logic circuit footprint. Cost savings may be achieved through the simpler design.

However, non-judicious sharing of all or part of a receive chain in carrier aggregation may affect reception of the PCC and may lead to service interruption. For example, when the PCC is the weaker signal of the component carriers, the PCC signal may be pushed into the quantization noise floor leading to RLF by application of a common gain that does not take into account potential differences in signal quality between intra-band CCs. The common gain control methods below may be configured to mitigate such undesirable effects by selecting the PCC for favorable treatment. The common gain control methods may also be configured to reduce the effects of undesirable radio channel characteristics.

FIGS. 4A-B illustrate examples of embodiments for common gain control in cases of intra-band carrier aggregation. FIG. 4A illustrates an example with multiple RF chains 508a-b. The front end module 392A may be configured for use in the UE 120 or eNB 110. When configured for use in the UE 120 or eNB 110, the front end module 392A may be situated between the antennas (352a-t in the eNB 110, or 352a-r in the UE 120) and DEMOD (354a-t in the eNB 110, or 354a-r in the UE 120). The front end module 392A may be located at the antennas of the UE 120 or eNB 110. The front end module 392A may include a gain control module 502 coupled to a variable gain element 506 for controlling the variable gain element 506. The variable gain element 506, for example, may be a low noise amplifier. The front end module 392A may include a mixer that may be used to convert the incoming signal to an intermediate frequency (IF). The front end module 392A may include a duplexer that may be used to route both receive and transmit signal to and from the same antenna.

Gain control module 502 may include the above-described means for obtaining the primary and secondary estimates, or it may receive the primary and secondary estimates from other components. Based on the primary and secondary estimates, the gain control module 502 may determine a common gain for the multiple component carriers, to be applied variable gain element 506. Alternatively, gain control module 502 may be implemented, at least in part, in a controller/processor 340, 380.

Because radio link monitoring is based on the PCC and the PCC may carry the control signaling for a group of component carriers, another aspect may include selecting the PCC for favorable treatment to avoid RLF. For example, depending on component carrier power imbalance, using a common gain based on a maximum value of component carrier signal power may push a weaker carrier into the quantization noise floor or subject the weaker carrier to non-linear scaling. If the PCC is the weaker carrier, using the common gain based on the maximum value may result in RLF. Therefore, one aspect of the disclosure may involve biasing the techniques to be used in determining the common gain in favor of the PCC.

Figure 5:
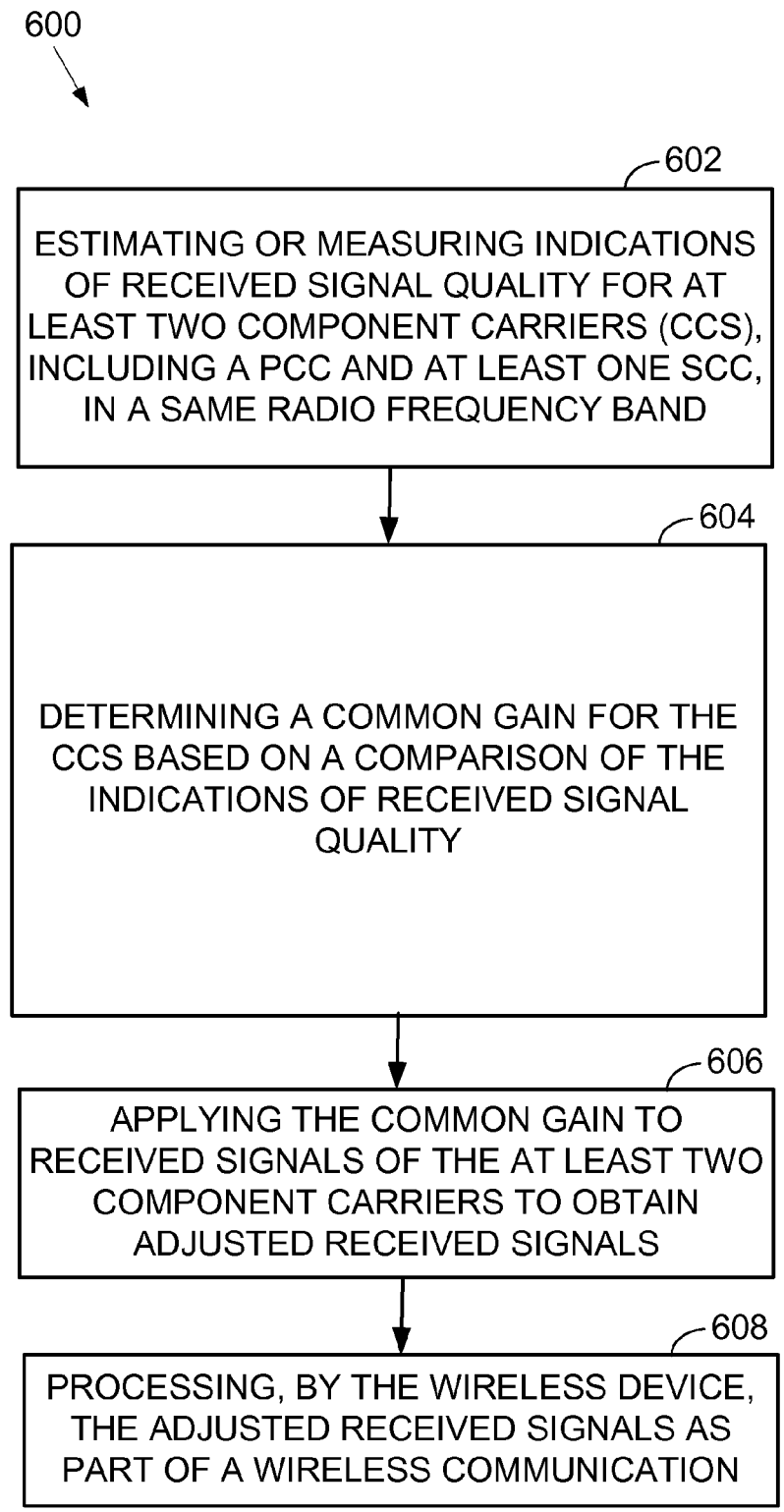
FIG. 5 illustrates an example of a methodology for gain control for intra-band aggregated carriers.

FIG. 5 shows an example 600 of how the common gain may be determined and applied. The example may begin by obtaining the primary and secondary estimates, by estimating and/or measuring indications of received signal quality, as discussed above, for multiple CCs in a frequency band 602. The primary and secondary estimates may then be compared, and a common gain may be determined based on the comparison 604. The common gain may then be applied to the received signals to obtain adjusted received signals 606. Finally, the device in which this process occurs may process the adjusted received signals as part of wireless communication 608.

Figure 6:
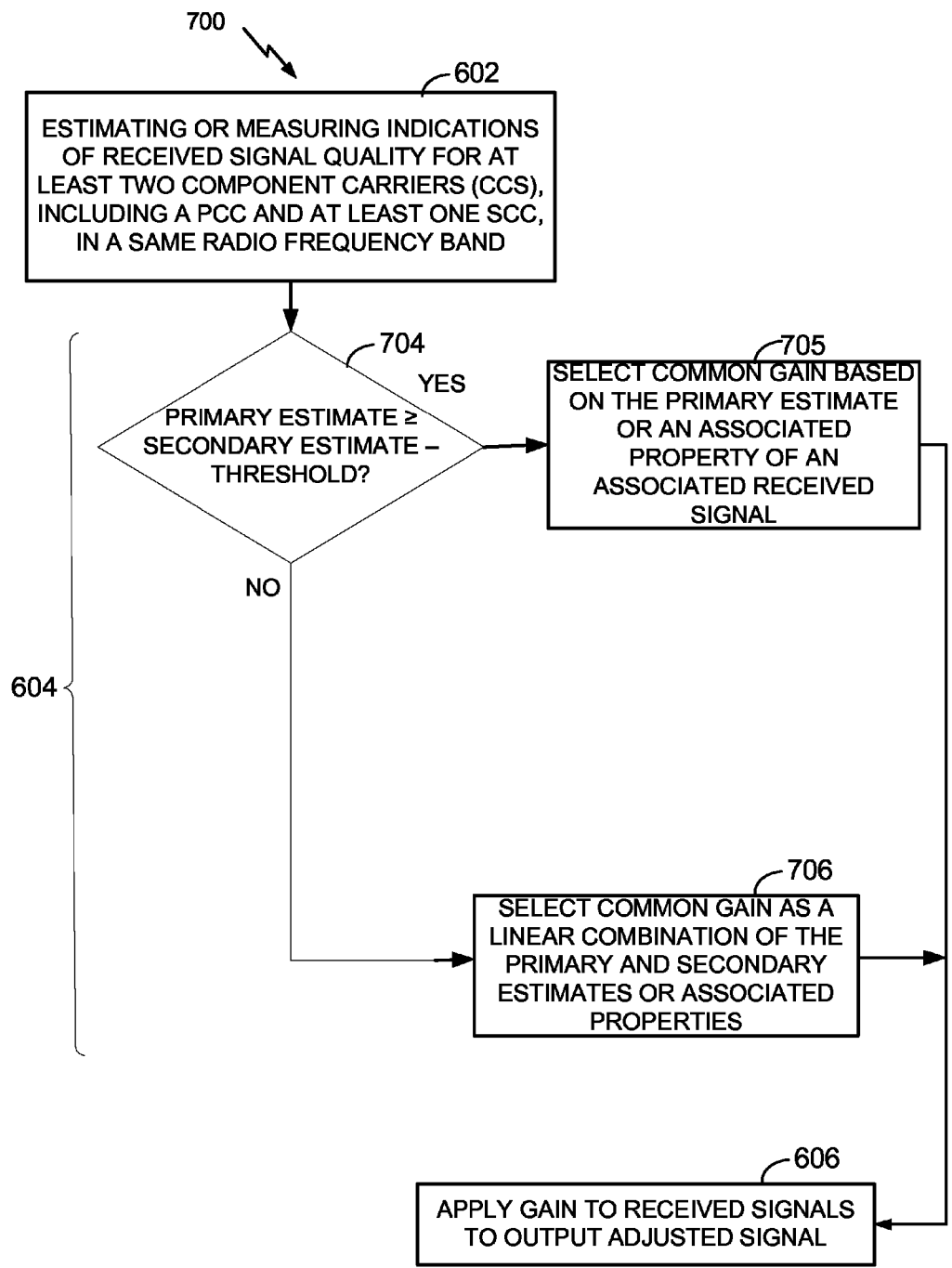
FIG. 6 illustrates another example of a methodology for gain control for intra-band aggregated carriers.

FIG. 6 shows a further example 700, in which further details are shown to demonstrate how the common gain may be determined 604. As in FIG. 5, the primary and secondary estimates may be obtained 602. The results may then be compared 704. In particular, a determination may be made in 704 as to whether the primary estimate is greater than or approximately equal to the secondary estimate. The "approximately equal to" portion of this comparison may be implemented via the use of the threshold value T.

To explain further, as noted above, wireless communication may generally be more sensitive to the fidelity with which the PCC is received than the fidelity with which SCCs are received. Hence, in some circumstances, it may be appropriate to bias the determination of the common gain in favor of the PCC. If, for example, the primary estimate is greater than or equal to the secondary estimate, the common gain may be determined based on the PCC 705. However, even if the primary estimate is less than the secondary estimate, it may be advantageous to determine common gain based on PCC 705 when the CCs differ by not more than some threshold amount T. T may be, for example, a predetermined threshold value based on an error rate criterion, such as a block error rate (BLER) criterion (e.g., to minimize a BLER or to provide a maximum allowable BLER), but is not necessarily limited thereto. Thus, according to an aspect of the present disclosure, the comparison of the primary and secondary estimates may be expressed as a determination of whether the primary estimate is greater than or equal to the secondary estimate minus T 704. It is understood that, in a particular sub-example, to which the disclosure is not limited, T may be equal to zero (resulting in a direct comparison without any threshold-based adjustment).

As a further note, for the sake of completeness, if the primary and secondary estimates correspond to, for example, error rate estimates, a better signal should result in a lower estimate. Hence, for such cases, although not shown in FIG. 6, the comparison criterion 704 may restated as whether the primary estimate is less than or equal to the secondary estimate plus T, where, again, T is chosen appropriately for the types of primary and secondary estimates being used (e.g., according to the corresponding RF characteristics).

Returning to FIG. 6, if the comparison criterion is not met 704, the common gain may be selected as a linear combination of the primary and secondary estimates or of properties of the PCC and one or more SCCs 706. For example, when the PCC signal is the lower-quality signal, based on the comparison 704, the common gain may be calculated based on a linear combination (i.e., $f(x, y)=\alpha^*x+\beta^*y$) of the PCC received signal power and SCC received signal power (where x represents the PCC received signal power and y represents the SCC received signal power). The coefficient values (e.g., $\alpha$ for the PCC signal and $\beta$ for the SCC signal) of the linear combination may be adjusted to bias gain control in favor of the PCC signal. For example, the $\alpha$ coefficient for the PCC signal may be chosen to be a larger value than the $\beta$ coefficient for the SCC signal. Note that this uses the example of signal power as an "associated property," but the "associated property" could similarly be signal level or some other property reflective of signal quality, and $\alpha$ and $\beta$ may be chosen accordingly.

In a further aspect of this disclosure, the coefficient values and/or the threshold value may be determined on a per-sub-frame basis.

In a variation, not specifically shown in the drawings, which may occur, e.g., in a case of inter-band carrier aggregation where the PCC is in a different band from two or more of the SCCs, if a common gain element is shared between the two or more SCCs, the common gain may be based on the maximum signal power (or best estimated indication of signal quality) of the SCCs sharing the common gain element. As RLF is not a concern in SCCs, the gain element may be selected to favor the strongest SCC and avoid signal to noise degradation in the strongest SCC by avoiding saturation.

Returning now to FIGS. 4A and 4B, once the common gain is determined, the common gain may be communicated by the gain control module 502 to the variable gain element 506, which may apply the common gain to the incoming signals from multiple component carriers. After the common gain is applied by the variable gain element 506, the output signals of the multiple component carriers may be separated into multiple RF chains 508a, 508b and passed to analog-to-digital converters (ADC) 510a, 510b, as shown in FIG. 4A. RF chain 508a may include other circuit elements such as filters, duplexers, baseband processors, etc. The outputs of the ADCs 510a, 510b may be passed along to MOD/DEMODs 354a, 354b for further processing.

In an example, for the front end module 392A configured as a component of UE 120, signals for the PCC and SCC may be transmitted by eNB 110 and received by the UE 120 at antenna 352a. Duplexer 504 may convert the PCC and SCC signals to an IF signal for processing by the variable gain element 506. The gain control module 502 may set the value of the gain for the variable gain element 506, as discussed above.

FIG. 4B illustrates an exemplary embodiment of a front end module 392A' with a shared RF chain 508c and ADC 510c. The hardware complexity of FIG. 4A is further simplified in FIG. 4B with shared components in the RF chain 508c and ADC 510c. The front end module 392A' may include a gain control module 502 coupled to a variable gain element 506 for controlling the variable gain element 506. The variable gain element 506, for example, may be a low noise amplifier. The front end module 392A' may include a duplexer that may be used to convert the incoming signal to an intermediate frequency (IF). After the common gain is applied by the variable gain element 506, the output signals of the multiple component carriers are passed to the RF chain 508c and to the ADC 510c. The RF chain 508c may include other circuit elements such as filters, duplexers, baseband processors, etc. After the ADC 510c, the signals pass to the MOD/DEMOD 354a for further processing, as discussed above.

Referring again to FIGS. 5-6, example methodologies relating to gain control for intra-band aggregated carriers are illustrated. While, for purposes of simplicity of explanation, the methodologies are shown and described as a series of acts, it is to be understood and appreciated that the methodologies are not limited by the order of acts, as some acts may, in accordance with one or more embodiments, occur in different orders and/or concurrently with other acts. For example, it is to be appreciated that a methodology could alternatively be represented as a series of interrelated states or events, such as in a state diagram. Moreover, not all illustrated acts may be required to implement a methodology in accordance with one or more embodiments.

Figure 7:
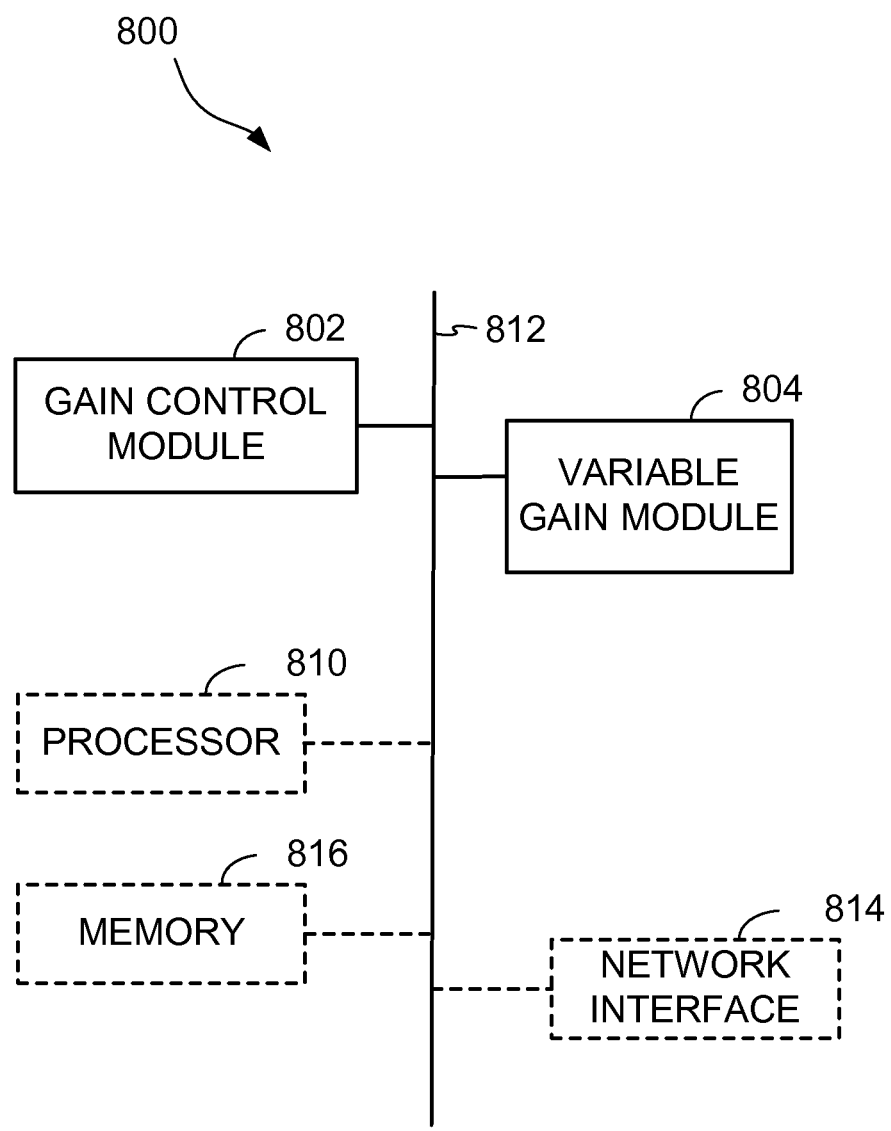
FIG. 7 shows an example of an apparatus for controlling gain of intra-band aggregated carriers, in accordance with the examples of methodologies of FIGS. 5-6.

FIG. 7 shows an embodiment of an apparatus for controlling gain in an intra-band carrier aggregation configuration, in accordance with the methodologies of this disclosure. With reference to FIG. 7, there is provided an exemplary apparatus 800 that may be configured as a wireless entity (e.g., UE 120 or eNB 110) in a wireless network, or as a front end module or similar device/component for use within the wireless entity. The apparatus 800 may include functional blocks that can represent functions implemented by a processor, software, or combination thereof (e.g., firmware). For example, apparatus 800 may include a gain control module 802. The gain control module 802 may be configured to receive or determine the primary and secondary estimates and may be configured to determining a common gain based on a comparison of the primary and secondary estimates. Gain control module 802 may include a processor or may utilize processor 810 in performing these functions. The apparatus 800 may include a variable gain module 804 that may be configured to apply the common gain to received signals to obtain adjusted received signals. The processor 810 or processors 810 may be coupled to memory 816 and may be configured to process the adjusted received signals as part of a wireless communication. The processor 810 may be a component of RF chain 508, MOD/DEMOD 354, or other module or components of UE 120 or eNB 110 that may be configured to process the adjusted received signals and/or to perform other functions.

In the case in which apparatus 800 corresponds to a wireless entity, rather than a front-end module, the processor component 810 may be in operative communication with the components 802-804 via a bus 812 or similar communication coupling and may effect initiation and scheduling of the processes or functions performed by components 802-804.

In further related aspects, the apparatus 800 may include a network interface component 814, which may be a radio transceiver component. A standalone receiver and/or standalone transmitter may be used in lieu of or in conjunction with the transceiver component. If the apparatus 800 is a network entity, the network interface 814 may be configured for connecting to one or more core network entities. The apparatus 800 may optionally include a component for storing information, such as, for example, a computer readable medium, which may be a memory device/component 816. The memory component 816 may be adapted to store computer readable instructions and/or data for effecting the processes and behavior of the components 802-804, and subcomponents thereof, or the processor 810, or the methods disclosed herein.

It is further noted that the components in FIG. 8 may comprise processors, electronic devices, hardware devices, electronic sub-components, logical circuits, memories, software codes, firmware codes, etc., or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware or a combination of both hardware and software. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media may include computer storage media and/or communication media including any media that facilitate transfer of a computer program from one place to another. A storage medium may be any available medium that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, or digital subscriber line (DSL), then the coaxial cable, fiber optic cable, twisted pair, or DSL are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically, e.g., with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is rather to be accorded the widest scope consistent with the principles and novel features disclosed herein.

What is claimed is:

1. A method for controlling gain in a multi-carrier wireless device, the method comprising:
   estimating or measuring, by the wireless device, indications of received signal quality for at least two aggregated component carriers (CCs) in a same radio frequency band, the at least two aggregated CCs comprising a primary component carrier (PCC) and one or more secondary component carriers (SCCs);
   determining, based on indications of received signal quality of the PCC, a primary estimate indicating a signal quality of the PCC alone;
   determining, based on indications of received signal quality of one or more SCCs, a secondary estimate indicating a signal quality of the one or more SCCs;
   when the primary estimate is greater than or approximately the same as the secondary estimate, determining a common gain for the at least two aggregated CCs using a first function;
   when the primary estimate is less than the secondary estimate, determining the common gain for the at least two aggregated CCs using a second function, wherein the second function comprises a linear combination of PCC received signal power and a signal power of one or more of the SCCs; and
   applying the common gain to received signals of the at least two aggregated CCs to obtain adjusted received signals.

2. The method of claim 1, wherein a respective indication of received signal quality is one of a power, a signal level, or an error rate.

3. The method of claim 1, wherein the primary estimate is approximately the same as the secondary estimate when the primary estimate is within some predetermined tolerance of the secondary estimate.

4. The method of claim 3, wherein the predetermined tolerance is determined based on an error rate criterion.

5. The method of claim 1, wherein the first function uses only one or more received signal characteristics of the PCC.

6. A wireless communication apparatus comprising:
   means for estimating or measuring indications of received signal quality for at least two aggregated component carriers (CCs) in a same radio frequency band, the at least two aggregated CCs comprising a primary component carrier (PCC) and one or more secondary component carriers (SCCs);
   means for determining, based on indications of received signal quality of the PCC, a primary estimate indicating a signal quality of the PCC alone;
   means for determining, based on indications of received signal quality of one or more SCCs, a secondary estimate indicating a signal quality of the one or more SCCs;
   means for determining a common gain for the at least two aggregated CCs using a first function when the primary estimate is greater than or approximately the same as the secondary estimate;
   means for determining the common gain for the at least two aggregated CCs using a second function when the primary estimate is less than the secondary estimate, wherein the second function comprises a linear combination of PCC received signal power and a signal power of one or more of the SCCs; and
   means for applying the common gain to received signals of the at least two aggregated CCs to obtain adjusted received signals.

7. The wireless communication apparatus of claim 6, wherein a respective indication of received signal quality is one of a power, a signal level, or an error rate.

8. The wireless communication apparatus of claim 6, wherein the primary estimate is approximately the same as the secondary estimate when the primary estimate is within some predetermined tolerance of the secondary estimate.

9. The wireless communication apparatus of claim 8, wherein the predetermined tolerance is determined based on an error rate criterion.

10. The wireless communication apparatus of claim 6, wherein the first function uses only one or more received signal characteristics of the PCC.

11. A non-transitory computer-readable medium including code for causing at least one computer to:
   obtain, by means of estimation or measurement, indications of received signal quality for at least two aggregated component carriers (CCs) in a same radio frequency band, the at least two aggregated CCs comprising a primary component carrier (PCC) and one or more secondary component carriers (SCCs);
   determine, based on indications of received signal quality of the PCC, a primary estimate indicating a signal quality of the PCC alone;
   determine, based on indications of received signal quality of one or more SCCs, a secondary estimate indicating a signal quality of the one or more SCCs;
   determine a common gain for the at least two CCs using a first function when the primary estimate is greater than or approximately the same as the secondary estimate;
   determine the common gain for the at least two aggregated CCs using a second function when the primary estimate is less than the secondary estimate, wherein the second function comprises a linear combination of PCC received signal power and a signal power of one or more of the SCCs; and
   cause the common gain to be applied to received signals of the at least two aggregated CCs to obtain adjusted received signals.

12. The non-transitory computer-readable medium of claim 11, wherein a respective indication of received signal quality is one of a power, a signal level, or an error rate.

13. The non-transitory computer-readable medium of claim 11, wherein the primary estimate is approximately the same as the secondary estimate when the primary estimate is within some predetermined tolerance of the secondary estimate.

14. The non-transitory computer-readable medium of claim 13, wherein the predetermined tolerance is determined based on an error rate criterion.

15. The non-transitory computer-readable medium of claim 11, wherein the first function uses only one or more received signal characteristics of the PCC.

16. A wireless communication apparatus comprising:
at least one antenna configured to receive signals including a frequency band containing at least two aggregated component carriers (CCs), the at least two aggregated CCs comprising a primary component carrier (PCC) and one or more secondary component carriers (SCCs);
a variable gain amplifier coupled to the at least one antenna and configured to apply a common gain to the aggregated CCs in the frequency band; and
a received signal quality evaluator configured to:
determine, based on indications of received signal quality of the PCC, a primary estimate indicating a signal quality of the PCC alone, and
determine, based on indications of received signal quality of one or more SCCs, a secondary estimate indicating a signal quality of the one or more SCCs; and
a gain control module coupled to the variable gain amplifier and configured to:
compare the primary estimate and the secondary estimate,
when the primary estimate is greater than or approximately the same as the secondary estimate, compute the common gain using a first function, and
when the primary estimate is less than the secondary estimate, compute the common gain using a second function, wherein the second function comprises a linear combination of PCC received signal power and a signal power of one or more of the SCCs.

17. The wireless communication apparatus of claim 16, wherein a respective indication of received signal quality is one of a power, a signal level, or an error rate.

18. The wireless communication apparatus of claim 16, wherein the primary estimate is approximately the same as the secondary estimate when the primary estimate is within some predetermined tolerance of the secondary estimate.

19. The wireless communication apparatus of claim 18, wherein the predetermined tolerance is determined based on an error rate criterion.

20. The wireless communication apparatus of claim 16, wherein the first function uses only one or more received signal characteristics of the PCC.

21. The wireless communication apparatus of claim 16, wherein the gain control module comprises:
at least one processor configured to perform one or more functions of the gain control module or one or more functions of the received signal quality evaluator or one or more functions of both the gain control module and the received signal quality evaluator; and
a memory coupled to the at least one processor.

* * * * *